(12) United States Patent
Hofmeister et al.

(10) Patent No.: US 7,196,294 B2
(45) Date of Patent: Mar. 27, 2007

(54) METHOD AND RESISTIVE BRIDGE CIRCUIT FOR THE DETECTION OF SOLDER-JOINT FAILURES IN A DIGITAL ELECTRONIC PACKAGE

(75) Inventors: James P. Hofmeister, Tucson, AZ (US); Philipp S. Spuhler, Brookline, MA (US); Bert M. Vermeire, Mesa, AZ (US)

(73) Assignee: Ridgetop Group, Inc., Tucson, AZ (US)

( * ) Notice: Subject to any disclaimer, the term of this patent is extended or adjusted under 35 U.S.C. 154(b) by 0 days.

(21) Appl. No.: 11/350,446

(22) Filed: Feb. 9, 2006

(65) Prior Publication Data

US 2006/0191889 A1 Aug. 31, 2006

Related U.S. Application Data

(60) Provisional application No. 60/657,101, filed on Feb. 28, 2005, provisional application No. 60/737,848, filed on Nov. 18, 2005.

(51) Int. Cl.
*H05B 1/02* (2006.01)

(52) U.S. Cl. ............... 219/499; 219/497; 219/505; 228/104; 228/179.1; 438/18; 438/108; 324/765

(58) Field of Classification Search ............ 219/233, 219/497, 499, 494, 505; 228/102–103, 104, 228/180.5, 179.1; 438/106, 14, 108, 18; 324/765

See application file for complete search history.

(56) References Cited

U.S. PATENT DOCUMENTS

| | | | | |
|---|---|---|---|---|
| 6,452,502 | B1 * | 9/2002 | Dishongh et al. | 340/653 |
| 6,469,537 | B1 * | 10/2002 | Akram et al. | 324/765 |
| 6,564,986 | B1 * | 5/2003 | Hsieh | 228/103 |
| 6,568,581 | B2 * | 5/2003 | Boller et al. | 228/103 |
| 6,788,092 | B2 | 9/2004 | Cheng | |
| 6,894,524 | B1 | 5/2005 | Grilletto | |
| 6,895,353 | B2 | 5/2005 | Barr | |
| 6,906,541 | B2 | 6/2005 | Kimura | |
| 6,927,589 | B2 | 8/2005 | Wark | |
| 6,940,288 | B2 | 9/2005 | Barr | |
| 6,978,214 | B2 | 12/2005 | Budell | |

OTHER PUBLICATIONS

Daisy Chain Samples, AMD Application Note #24571, Oct. 25, 2001, pp. 1-3.

(Continued)

*Primary Examiner*—Mark Paschall
(74) *Attorney, Agent, or Firm*—Eric A. Gifford

(57) ABSTRACT

A solder-joint detection circuit uses a resistive bridge and a differential detector to detect faults in the solder-joint network both inside and outside the digital electronic package during operation. The resistive bridge is preferably coupled to a high supply voltage used to power the package. Resistors R1 and R2 are connected in series at a first junction between the high and low supply voltages and a resistor R3 is coupled to the high supply voltage and connected in series with the resistance of the solder-network at a second junction. The network is held at a low voltage on the die. The detector compares the sensitivity and detection voltages and outputs a Pass/Fail signal for the solder-joint network.

30 Claims, 6 Drawing Sheets

OTHER PUBLICATIONS

Ranjit Gannamani et al. Reliability Evaluation of Chip Scale Packages, AMD, pp. 4-10, 2001.
James Chan, Four-Point Probe Manual, University of California, Berkely, EECS 143, 1994.
Roger Rorgren et al., Reliability of BGA Packages in an Automotive Environment, Proc. Surface Mount International, San Jose, 1997.
Solder Joint Monitoring System, 04013-13013, Symtx Corp. www.symtx.com, downloaded Dec. 12, 2005.
MK Test Systems AutoMeg Product Range, MK Test Systems, www.mktest.com, downloaded Dec. 19, 2005.

* cited by examiner

METHOD AND RESISTIVE BRIDGE CIRCUIT FOR THE DETECTION OF SOLDER-JOINT FAILURES IN A DIGITAL ELECTRONIC PACKAGE

CROSS-REFERENCE TO RELATED APPLICATIONS

This application claims benefit of priority under 35 U.S.C. 119(e) to U.S. Provisional Application Nos. 60/657,101 entitled "Non-Invasive Real Time Method for the Detection of Solder Joint Failures" filed on Feb. 28, 2005 and 60/737,848 entitled "Real-Time, In-Situ Method for the Detection of Solder-Joint Fatigue Damage Using the Solder Joint as a Resistive Switch" filed on Nov. 18, 2005, the entire contents of which are incorporated by reference.

Governmental Rights

This invention was made with Government support under Contract N6833505-C-0101 awarded by Naval Air Warfare Center AD (LKE). The Government has certain rights in this invention.

BACKGROUND OF THE INVENTION

1. Field of the Invention

This invention relates to a method and circuit for detection of failures in the solder-joint networks in digital electronic packages such as Field Programmable Gate Arrays (FPGAs) and Microcontrollers and between the package's ball grid array (BGA) and printed wire boards (PWBs).

2. Description of the Related Art

Solder-joint connections from digital electronic packages such as FPGAs or Microcontrollers to Printed Wire Boards (PWB) are a major reliability problem. Modern Ball Grid Array (BGA) packages have several thousand pins and the number of pins on these packages is likely to increase over the next several years. The increased number of pins on the packages is necessary to support the evolving complexity of circuits; however, one of the drawbacks of the increase is reduced reliability. For many applications it would be useful to detect failures or precursors to failures in mechanical connections that lie inside the digital logic on the die, through the multiple mechanical connections and solder-joint connections between the die and package and through the external solder-joint connections to circuitry on the PWB; together the "solder joint network".

As shown in FIG. 1, an exemplary FPGA 10 includes at least one flip-chip 12 consisting of a die mount 18 and die 16 mounted inside a cavity 14 of a BGA package 22. Electrical components such as transistors, diodes and capacitors that are configured via mechanical connections such as aluminum or copper traces or tungsten vias on a die 16 together constitute the FPGA. The FPGA includes write logic that is connected through an output buffer to a pad on the die. Similarly an input buffer is connected from a pad to read logic. Flip-chip 12 is placed inside BGA package 22 so that the solder balls 20 (also called solder bumps) inside the BGA package 22 touch pads, lands or vias of flip-chip 12 and they are soldered to form solder-joint connections. Vias lead from contacts (not shown) of solder bumps 20 to an outside ball limiting metallurgy (BLM) 24 and primary BGA solder balls 26 to complete the FPGA 10. The FPGA is placed so that primary BGA solder balls 26 contact solder paste on metal LANDs 28 on a PWB 30. The assembled PWB is heated and the solder balls 26 and solder paste melt and reflow to attach themselves to the metal LAND. The PWB is configured so that the metal LANDs are connected by vias and/or wiring 32 to one or more I/O nodes 34 for external circuitry on the PWB.

As shown in FIG. 2, the integrity of the external solder joint can be evaluated by measuring the bump connection resistance of a BGA package 40 flip-chip mounted to a PWB 41 during a test and judging defects by the degree of change in the connection resistance. Wire segments 42 connect vias 43 inside the package and PWB wiring 44 connects pads 45 on the PWB to connect solder bumps 46 attached to ball-limiting metallurgy 47 from the primary BGA in a "daisy chain". A meter 48 directly measures the resistance for all bumps 46 at the same time by either applying a voltage and measuring a current or vice-versa. The meter is typically a large, heavy and expensive piece of test equipment that applies well-regulated (low noise) voltages, unlike the actually power supplies on operational packages. Alternately, the wire segments and PWB can be configured to measure the resistance between two bumps 46 at a time, so increases in resistance due to cracking can be monitored.

The techniques for direct measurement of the solder-joint resistance have a number of limitations. The BGA package and PWB are 'blanks' or 'dummies' configured for a 4-wire or 2-wire continuous measurement, and therefore the test packages are not the same as the operational devices. Specifically, the package does not include the FPGA flip-chip containing the operational logic gates and buffers. It follows that these tests cannot be performed on actual operational devices, either in the lab or particularly in the field, and can not be monitored 24-7. Finally, although there are several instruments available to perform these measurements, besides being bulky and suitable for lab testing, these instruments cannot be used to perform real-time, in-use testing of fielded, operational FPGA BCA solder joint networks.

SUMMARY OF THE INVENTION

The following is a summary of the invention in order to provide a basic understanding of some aspects of the invention. This summary is not intended to identify key or critical elements of the invention or to delineate the scope of the invention. Its sole purpose is to present some concepts of the invention in a simplified form as a prelude to the more detailed description and the defining claims that are presented later.

The present invention provides a simple, inexpensive and low power method and circuit for monitoring 24-7 the integrity of solder-joint networks from the internal die connections to the external package connections during normal operation of digital electronic packages, such as FPGAs or microcontrollers. The invention is particularly applicable to high density ball grid array (BGA) packages.

This is accomplished with a digital electronic package that comprises a solder-joint network including at least a mechanical connection on a die and an external solder-joint connection. One side of the network is held at a low voltage on the die, suitably by pulling an output buffer in the network low at the mechanical connection. A resistive bridge is connected to the external solder-joint connection between high and low supply voltages. The resistive bridge includes a first resistive-divider leg of resistors R1 and R2 connected in series between the high supply voltage and the low supply voltage (e.g. ground). The junction of R1 and R2 establishes a sensitivity voltage. A second resistive-divider leg includes a resistor R3 coupled to the high supply voltage and connected in series with the effective resistance (RSJ) of the solder-joint network. The junction between R3 and RSJ (e.g. the external solder-joint connection) establishes a detection voltage across the solder-joint network.

A detector compares the detection voltage to the sensitivity voltage and outputs a Pass/Fail signal for the solder-joint network. If the network is healthy, its effective resistance, hence the voltage at the R3/RSJ junction will be low and the detector will indicate a Pass. However, if a fault occurs anywhere in the network, it is as though a high-value resistor was switched into the solder joint network, which has the effect of increasing the detection voltage. When the network resistance exceeds a nominal trigger value, the detection voltage becomes high enough to switch the fault detector causing it to indicate a Fail. Supply noise is both attenuated and partially rejected in the common mode. Proper selection of R1 and R2 allows for the establishment of the desired noise sensitivity (to prevent false positives) and the detection of small network resistances as failures. Both aspects are important for providing reliable detection in an operating package that has noisy supplies and buffers and for detecting small increases in network resistance that are precursors for network failure. By connecting the resistive bridge between the high and low supply voltages and one side of the solder-joint network to the low supply voltage, both noise tolerance and detection sensitivity can be achieved without drawing an unacceptable amount of power for the detection circuit.

These and other features as well as advantages of the invention will be apparent to those skilled in the art from the following detailed description of preferred embodiments, taken together with the accompanying drawings, in which:

DETAILED DESCRIPTION OF THE INVENTION

The present invention provides a method for evaluating solder-joint integrity of operational digital electronic packages, such as FPGAs or Microcontrollers, that have internal and external solder-joint connections, and particularly for evaluating the integrity of the solder-joint network during normal operation of the digital electronic packages. The invention will be described for a FPGA including a flip-chip mounted in a BGA package that is soldered to a PWB in which the solder-joint network includes a mechanical connection at the output of an I/O buffer on the die, a number of other internal mechanical connections or solder-joints and an external solder-joint between the package and PWB. But it will be understood that the method and circuit for evaluating solder-joint integrity is generally applicable to any digital electronic package that has a mechanical connection on the die regardless of whether the die is configured as an FPGA, microcontroller or otherwise, or whether a specific mount method, such as a flip-chip is used, or whether a specific bonding method, such as wire bonding is used, or regardless of a specific package type such as BGA or a Fine-pitch BGA, or whether a socket is used prior to assembly on the PWB.

Figure 3:
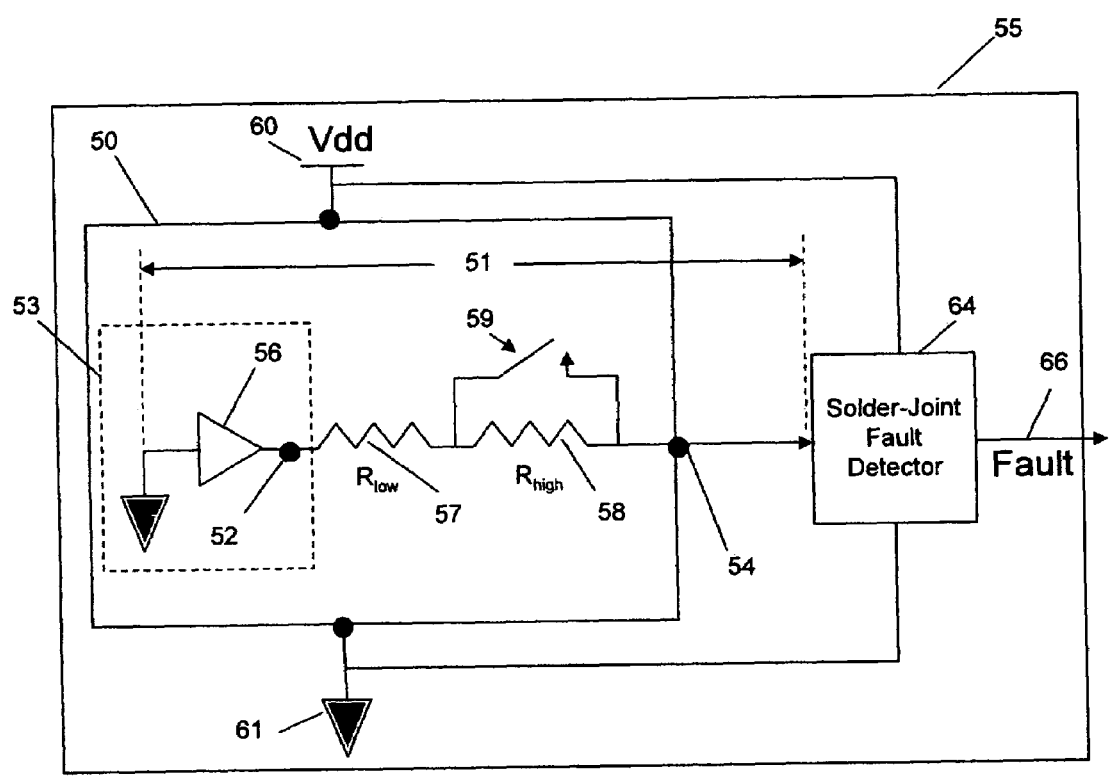
FIG. 3 is a schematic block diagram of a solder-joint fault detector connected to a solder-joint network in accordance with the present invention.

As shown in FIG. 3, an FPGA 50 has a solder-joint network 51 that includes mechanical connection 52 such as an aluminum or copper trace or tungsten via at, for example, the output of output buffer 56 on a die 53 and an external solder-joint 54 between the package and a PWB 55. The network also includes any number of intermediate mechanical connections and solder-joint connections (not shown) between the die and the package. The effective resistance of the network is illustrated schematically by a low resistance $R_{low}$ 57 and a high resistance $R_{high}$ 58. If the network is good, $R_{high}$ is bypassed and the effective resistance is low. If the network is bad (or showing signs of going bad), $R_{high}$ is "switched" (schematic switch 59) into the network and the effective resistance is high. Ordinarily, the output buffer would be driven high towards a high supply voltage Vdd 60 or low towards a low supply voltage (ground) 61 by write logic on the FPGA to execute the application.

In accordance with the invention, one side of the solder-joint network 51 is held at a low voltage, e.g. near ground 61, on the die. High and low supply voltages are routed to the die via other internal and external connections, including one or more solder joints, to the high supply 60 and external ground 61 off-chip. In this particular embodiment, the buffer input is tied to ground thereby pulling its output low. Alternately, a low voltage could be "written" to the buffer. If the buffer is an inverter, a high voltage is applied to the buffer to pull its output low. By holding the buffer low, it functions as a passive component with an effective low resistance determined by its low-on voltage (Vlo). This in turn allows for a sufficient detection voltage to be established across the network at external solder-joint 54 to enable the detection of a failure in the network in the presence of noise on the power supplies, buffer and other components.

A solder-joint fault detector 64 is connected at the external solder-joint connection 54 between the high and low supply voltages, preferably the same supply voltages as used to power the FPGA. The detector can be implemented as discrete or integrated components and may be wholly or partially integrated in the FPGA. The detector resistively couples the external solder-joint connection 54 to the high supply so that a detection voltage at that connection can swing low if the network resistance is low and high if the network resistance is high. The detector resistively divides the supply voltages to produce a sensitivity voltage. The resistive divider is preferably configured to attenuate the supply noise. If the detection voltage exceeds the sensitivity voltage by an amount sufficient to turn on the detector, the detector outputs a fault signal 66. Differential detection provides a degree of common mode rejection of power supply noise with any residual noise being highly attenuated by the resistive dividers. A proper configuration of the detector allows for the establishment of the desired noise sensitivity (to prevent false positives) and the detection of smaller network resistances as failures at acceptable power levels. All three aspects are important for providing reliable detection in an operating package that has noisy supply voltages and buffers and for detecting small increases in network resistance that are precursors for network failure.

Figure 1:
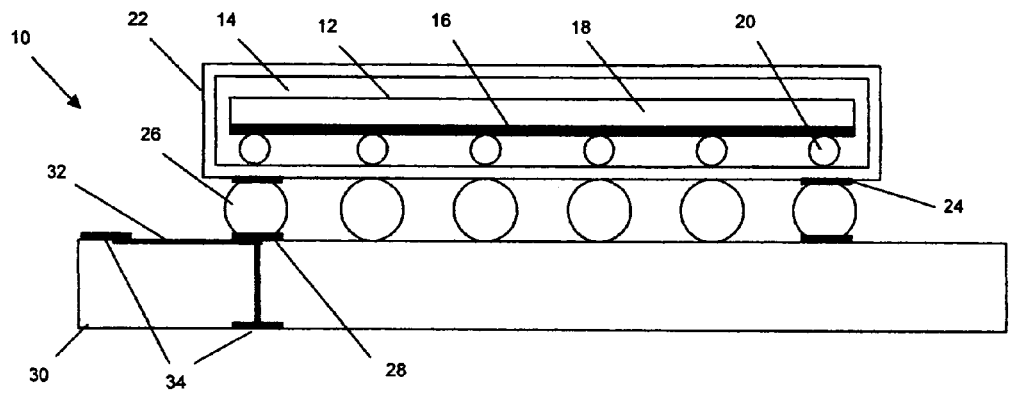
FIG. 1, as described above, is a diagram illustrating the solder-joint network in a typical digital electronic package.
Figure 2:
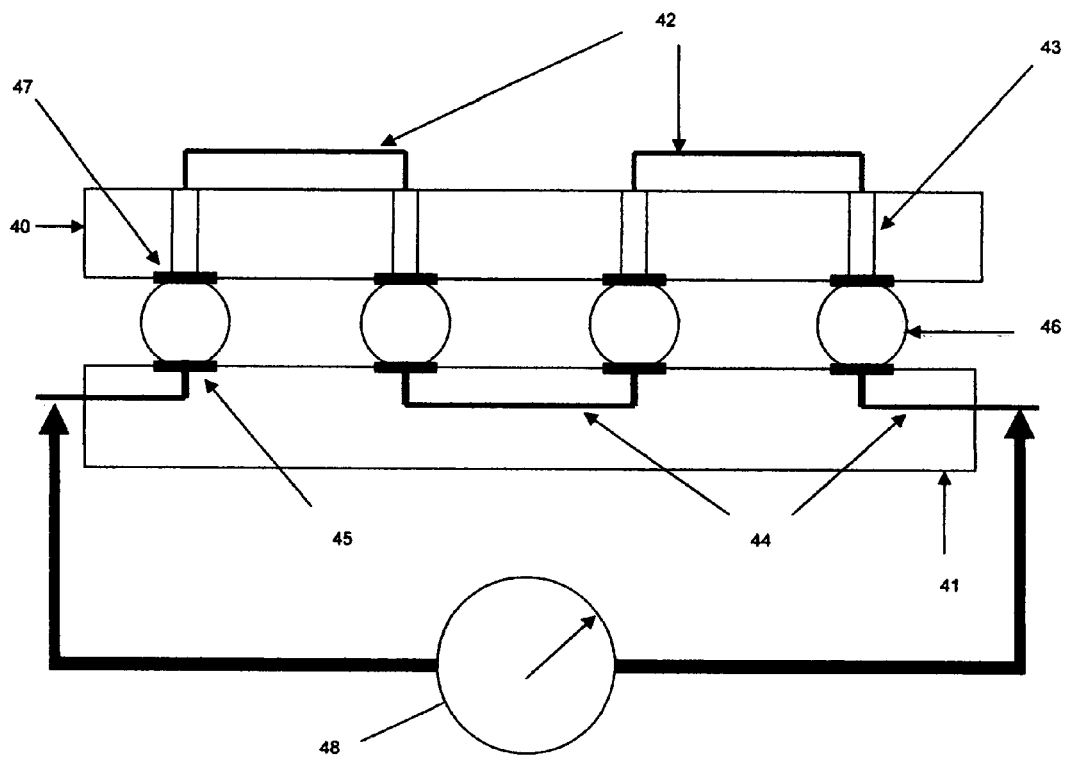
FIG. 2, as described above, is a diagram of a conventional direct resistance measurement to evaluate the integrity of the solder joints formed between the primary BGA of a blank BGA package and the PWB.
Figure 4:
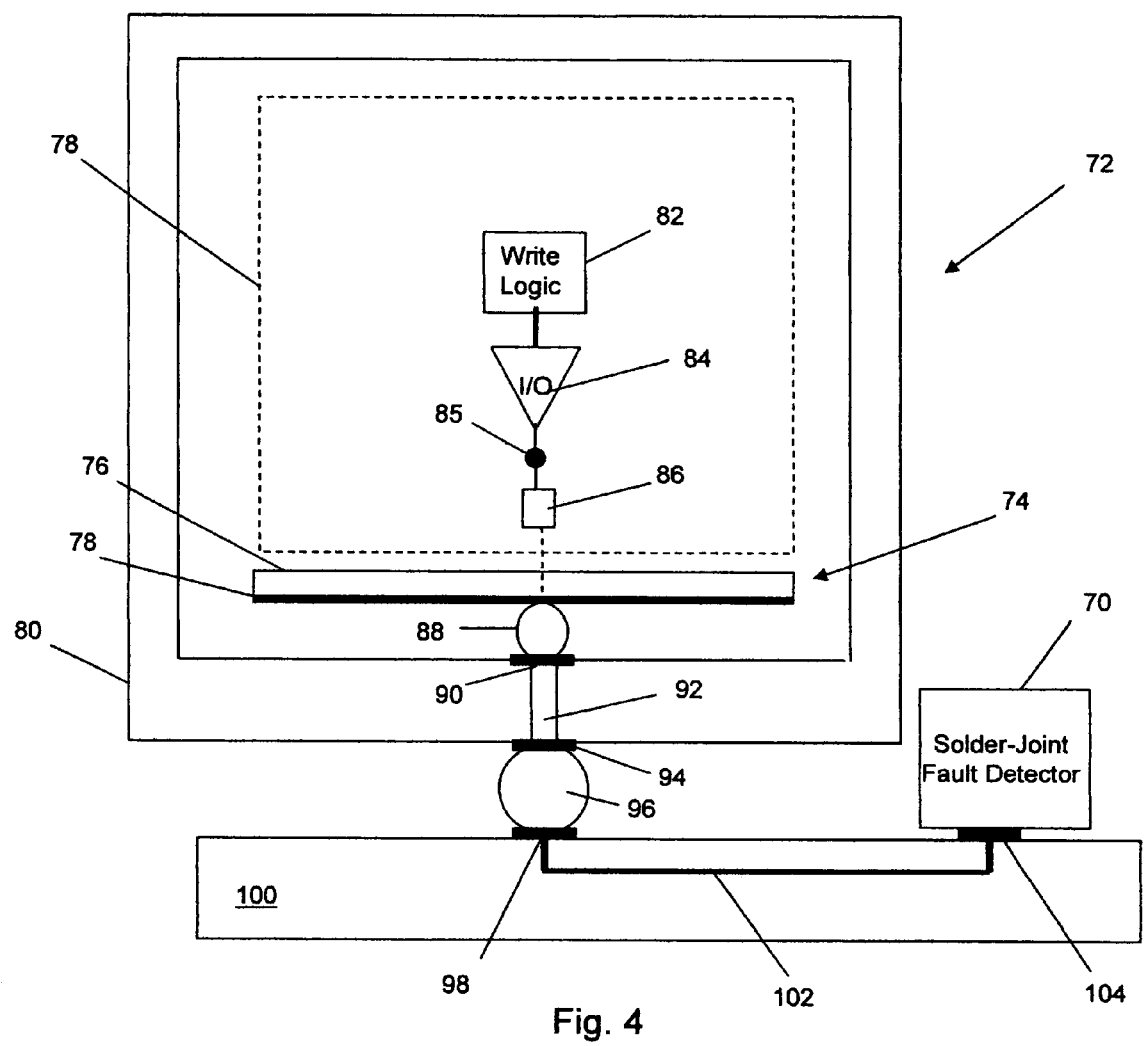
FIGS. 4 and 5 are respectively diagrams of the physical and electrical topology of the solder-joint fault detector connected to a solder-joint network.
Figure 5:
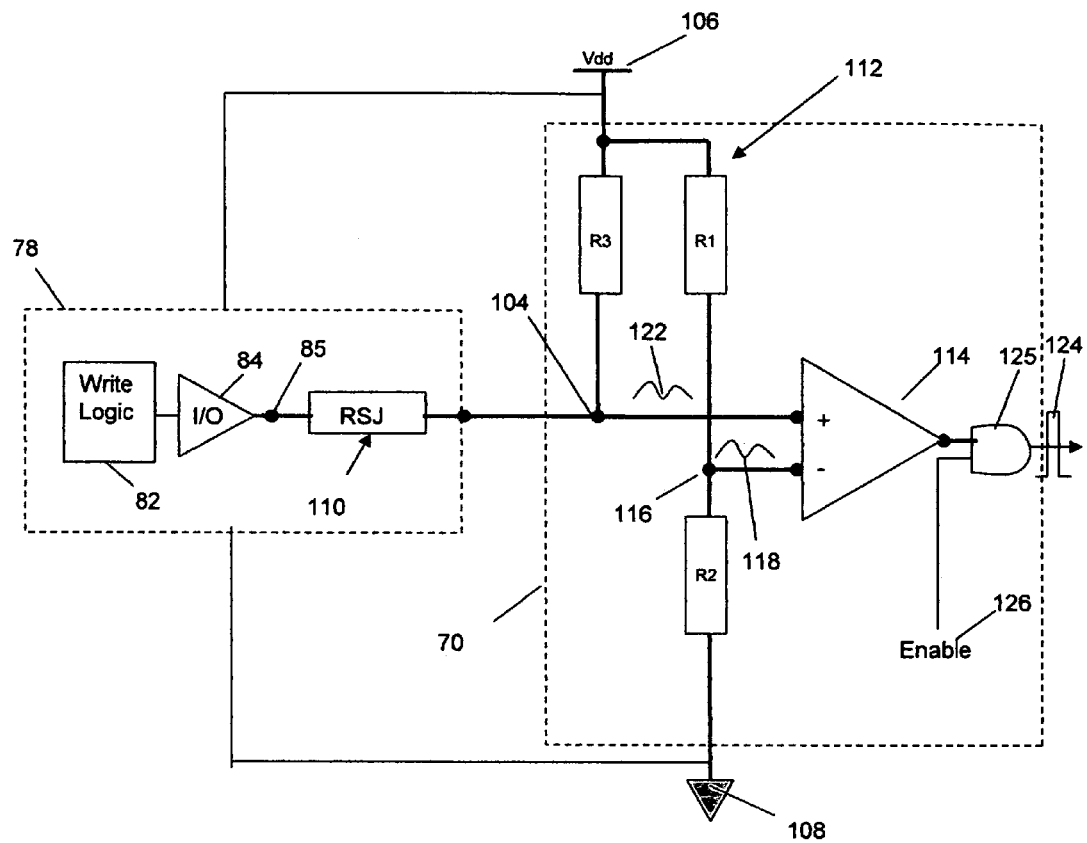

The physical and electrical topology of an exemplary embodiment of a solder-joint fault detector 70 and the internal configuration of an FPGA 72, of the type shown above in FIG. 1, for detecting solder-joint failures are shown in FIGS. 4 and 5. Only the FPGA configuration and detector for a given test pin or ball are shown. It is understood that other test pins may also be configured in this way and that most of the pins will be configured for normal FPGA operation.

FPGA 72 includes a flip-chip 74 consisting of a die mount 76 and a die 78 inside a BGA package 80. Die 78 is shown both physically and schematically to illustrate the network. In general, the FPGA includes read logic (not shown) and write logic 82 that is connected through I/O buffers 84 via internal mechanical connections 85 to output pads 86 on the die. Solder balls 88 form solder-joint connections between output pads 86 and pads 90 on the inside of BGA package 80. Vias 92 in the package connect pads 90 to a ball limiting metallurgy (BLM) 94 outside the package to which is attached a solder ball 96. The FPGA is placed so that solder balls 96 contact solder paste on metal LANDs 98 on a PWB 100. The assembled PWB is heated and the solder balls 96 and solder paste melt and reflow to attach the solder balls to the metal LANDs. The PWB is configured so that the metal LANDs are connected by vias and/or wiring 102 to one or more I/O nodes 104 for external circuitry on the PWB. For example, the high supply voltage 106 and ground (low supply voltage) 108 are connected to respective nodes and routed onto the die for use by the FPGA.

In accordance with the invention, write logic 82 pulls the output of I/O buffer 84 low to hold a low voltage at mechanical connection 85 of the solder-joint network. The network includes the I/O buffer, multiple internal mechanical and solder-joint connections including the "buffer connection", "die connection" and "flip-chip" connections, and the external "package connection" formed between the BGA package and PWB. The effective resistance of the network except the buffer is represented by RSJ. The write logic may be digital logic or simply a connection to ground on the die. Solder-joint fault detector 70 is connected to junction 104 on the PWB between ground and the high supply 106 for the FPGA.

In an exemplary embodiment, fault detector 70 includes a resistive bridge 112, a differential comparator 114 and a logic gate 125. The resistive bridge includes a first resistive-divider leg of resistors R1 and R2 connected in series between the high supply voltage (Vdd) 106 and the low supply voltage 108 (e.g. ground). The junction 116 of R1 and R2 establishes a sensitivity voltage 118. A second resistive-divider leg includes a resistor R3 coupled to the high supply voltage and connected in series with the effective resistance RSJ 110 of the solder-joint network. The junction 104 between R3 and RSJ (e.g. the external solder-joint connection) establishes a detection voltage 122 across the solder-joint network. As shown R3/RSJ is connected to the non-inverting input and R1/R2 is connected to the inverting input of the comparator so that when a fault occurs the comparator switches high. These connections and the polarity of the fault signal may be reversed.

Comparator 114 compares the detection voltage to a fault trigger voltage, i.e. the sensitivity voltage offset by the differential voltage at the input of the comparator required to turn on the logic gate, and causes a Pass/Fail signal 124 for the solder-joint network to be output. In the illustrated embodiment, a fairly low gain comparator is used. As a result, the output of the comparator rises and falls like a sawtooth as the differential input varies, instead of switch between binary states as is preferable. Therefore logic gate 125 is used to condition the signal and force the output 124 to a binary state to indicate a pass or fail condition. If an AND gate is used for signal conditioning, the detection circuit can be selectively disabled by setting an enable signal 126 to zero. This may be useful to mask false positives that might occur during power on or power off, for example. Alternatively, a high-gain fast-switching comparator may be used and logic gate 125 will not be needed to condition the signal; a logic gate might still be used for other purposes such as enabling/disabling the detector output 124. It is understood that other types of gates, e.g. a NAND gate or flip-flop gate/latch, can be used for signal conditioning and selective enabling and disabling.

Figure 6:
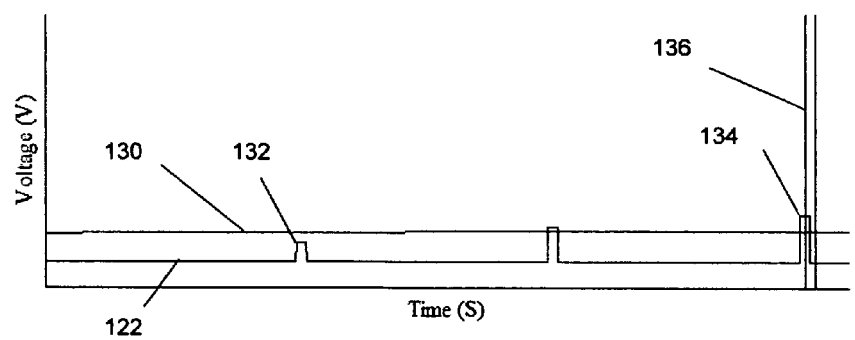
FIG. 6 is a plot illustrating the detection of a solder-joint fault as a function of the sensitivity and detection voltages.

A simplified diagram of the voltages, without supply and buffer noise, is illustrated in FIG. 6. If the network is healthy, it's effective resistance RSJ, hence the detection voltage 122 at the R3/RSJ junction 104 will be less than the fault trigger voltage 130 and the detector will indicate a Pass. However, if a fault occurs anywhere in the network, it is as though a high-value resistor was switched into the solder joint network, which has the effect of increasing the detection voltage 122. If the fault is such that the network resistance, hence detection voltage 122 increases to a voltage 132 that is not enough to switch the AND gate then no fault is declared. Note, although buffer noise is not specifically depicted in detection voltage 122, buffer noise that exceeds the maximum design value could have a similar effect of increasing the detection noise. If the resistive bridge is designed properly, voltage spikes due to noise should not trigger the comparator except in rare instances or on the occasion of certain events, e.g. power up, during which the AND gate may be disabled to mask false detections. When the fault is such that the network resistance exceeds a nominal trigger value, the detection voltage 134 becomes high enough to sufficiently exceed the fault trigger voltage 130 to switch the AND gate to output a Fail signal 136. It is worth noting that if the actual buffer noise is less than maximum design value, the network resistance may have to be somewhat larger to switch the AND gate.

As described previously, a topology in which the top of the resistive bridge is coupled to the high supply and one side of the solder-joint network is held low on the die and the proper selection of R1 and R2 allows for the establishment of the desired noise sensitivity (to prevent false positives) and the detection of smaller network resistances RSJ as failures at acceptable power levels. All three aspects are important for providing reliable detection in an operating package that has noisy supply voltages and buffers and for detecting small increases in network resistance that are precursors for network failure. The configuration of the resistive bridge is governed by the following three equations:

Equation 1: Detection Sensitivity Voltage (Vsense)

$Vsense = Vdd \times (R2)/(R1+R2)$, assuming the low supply voltage is ground.

Equation 2: Fault Trigger Voltage (VFT)
   VFT=Vsense+Von, where Von is the voltage difference between the inverting and non-inverting inputs of the comparator required to switch the AND gate. This voltage difference is a function of both the AND gate and the gain of the comparator.

Equation 3: Fault Detection Voltage (VFD)
   VFD=(Vdd−Vlo)×(RSJ)/(RSJ+R3)+Vlo, where Vlo is the maximum output voltage of the buffer when held in its low state, e.g. its output voltage plus the maximum noise. Note, if the network does not include a buffer, Vlo represents the maximum offset or noise on the junction due to any other sources.

Figure 7:
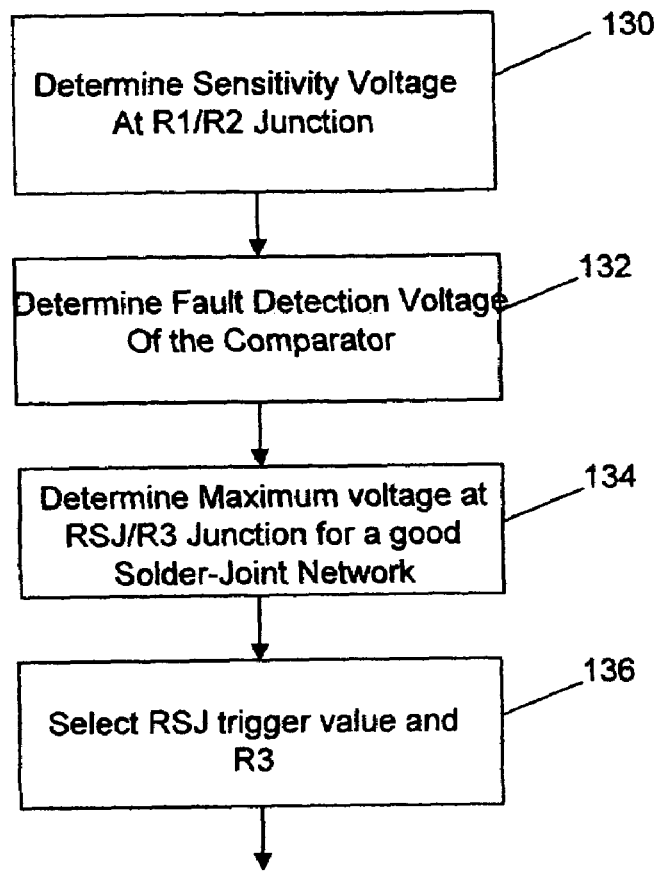
FIG. 7 is a flow diagram for selecting the resistor values for the resistive bridge in a solder-joint fault detector.

As shown in FIG. 7, these equations are used to select appropriate values for R1, R2 and R3 to achieve a desired noise sensitivity to prevent false triggers on nominal network resistance and noise. The first step is to determine the sensitivity voltage as given by eqn. 1 (step 130). This is done by setting the ratio R1/R2 to resistively divide the high supply down to the desired level. The ratio R1/R2 is preferably greater than one to attenuate the supply noise to provide a stable sensitivity voltage. The attenuation also serves to minimize any residual noise that is not eliminated by common mode rejection. If the ratio is too large the sensitivity voltage will be too small to effectively reduce false triggers. A range of 10:1 to 25:1 may be typical. The values of R1 and R2 are selected to limit current, hence power consumption. The next step is to determine the fault trigger voltage as given by eqn. 2 (step 132). This is simply the voltage differential Von necessary to cause the comparator to turn on the AND gate plus the nominal sensitivity voltage. Note, if the comparator has very high gain or if a logic gate is not used to condition the signal, the fault trigger voltage is equal to the sensitivity voltage.

Once the fault trigger voltage is set, the next step is to determine the maximum voltage at the junction of RSJ and R3 assuming the solder-joint network is sound and any voltage contribution is negligible (step 134). Note, in some cases it may be desirable to determine this maximum voltage up front as it may impact the selection of R1/R2 and the determination of the sensitivity voltage. In the present network configuration, this voltage is the maximum output voltage Vlo of the pulled-low buffer including noise. Lastly, a nominal trigger value is selected for RSJ, which is application dependent, and a value for R3 is calculated (step 136). Typical values for RSJ may range from a few hundred ohms to a few kilo-ohms. This is done by equating the fault detection voltage (VFD) in eqn. 3 with the value calculated for the fault trigger voltage (VFT) in eqn. 2. The selection of the RSJ trigger value determines the value of R3.

In theory, the resistive bridge and detector could be configured to trigger off any value of RSJ with a wide range of noise sensitivities at the RSJ/R3 junction. However, in practice, the circuit must account for errors in the nominal resistance values, power consumption issues, variations in components, temperature variations, etc and balance the desire to minimize false positives due to noise against the desire to trigger fault detection at or near the nominal trigger value for RSJ. Therefore, in general, the sensitivity to noise must be traded off against the ability to detect small network resistances as faults.

More specifically, as given by eqn. 3 the detection voltage is the sum of the voltage across the network plus the maximum noise voltage at the R3/RSJ junction. When the network is good, RSJ is approximately zero ohms and the first term is negligible. This in effect creates a "margin" voltage that is built into the circuit to provide additional noise tolerance. When the network is good, the actual noise at the R3/RSJ junction may exceed the max designed value and still not trigger a false positive. This may in some applications be desirable. However, for a given trigger value of RSJ a larger margin voltage corresponds to a smaller R3 value, which increases power consumption. Similarly, for a given power level, a larger margin voltage corresponds to a larger RSJ trigger value. Alternately, R1/R2 can be selected so that the margin voltage is fairly small allowing for both small RSJ trigger value and a large R3. Another approach is to iterate the design equations so that Vlo plus the margin voltage is approximately equal to the actual max noise value expected at the R3/RSJ junction. For example if the buffer low voltage plus max noise is designed for 100 mV, this could be accommodated for by setting Vlo=100 mV with no margin voltage or by setting Vlo=75 mV with a 25 mV margin. Conversely, if the estimate of the maximum noise at the R3/RSJ junction is conservative (high), the network resistance may have to exceed the trigger value by some marginal amount to trigger a fault. The design equations can be iterated to mitigate this variation as well. As in any circuit, design choice will have to be made to balance competing interests, manage power consumption and make the circuit robust.

Figure 8:
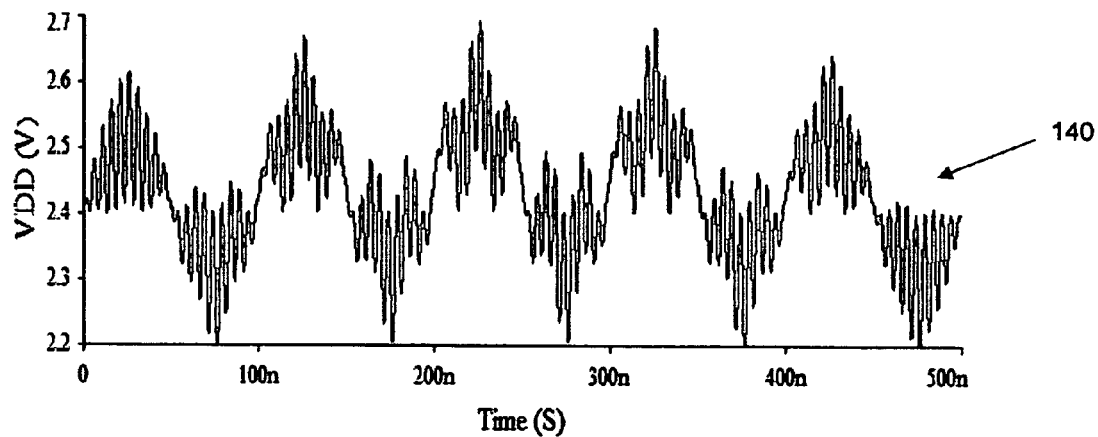
FIG. 8 is a plot of a noisy high supply voltage.
Figure 9A:
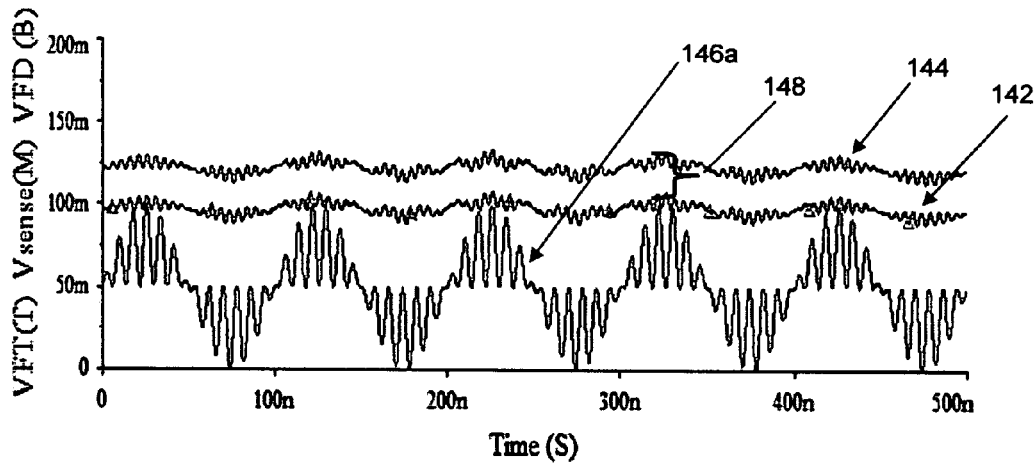
FIGS. 9a and 9b are plots of the sensitivity and detection voltages without and with failures in the solder-joint network.
Figure 9B:
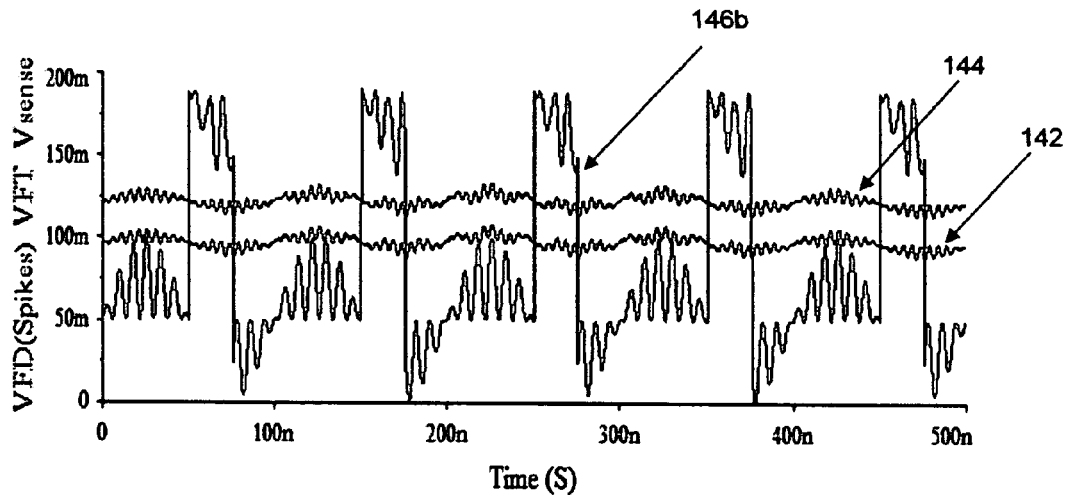

An exemplary embodiment of the solder-joint detection circuit was simulated and the results are illustrated in FIGS. 8 and 9a–9b. As shown in FIG. 8, the high supply voltage 140 is nominally 2.4V with noise sources of 100 mV peak-to-peak at 1 MHz and 50 MHz and 200 mV peak-to-peak at 10 MHz and 200 MHz for a maximum noise of 600 mV peak-to-peak to demonstrate the robustness of the circuit. Note typically noise sources are about 10% or less of the nominal supply or in this case 250 mV. The ratio R1/R2 was selected to be 24:1 with R1=48,000 ohms and R2=2,000 ohms so that the sensitivity voltage 142 is nominally 100 mV and the power supply noise is attenuated to about 25 mV peak-to-peak. The fault trigger voltage 144 is the sensitivity voltage offset by Von, e.g. 25 mV in this example, or approximately 125 mV. The buffer is considered to have a low output voltage of nominally 50 mV with noise sources of 50 mV peak-to-peak at 10 MHz and 125 MHz for a maximum noise level of 100 mV peak-to-peak. The margin voltage is approximately 25 mV. The trigger value of RSJ is selected to be 200 Ohms whereby R3=4,800 ohms and the detection circuit draws approximately 1.2 mW of nominal quiescent power. The ratio R1/R2=24 and R3/(RSJ+Rbuffer)=23 where Rbuffer=208 ohms when the buffer is held low and RSJ is negligible when the network is good. As a result, when the network is good a large portion of the common mode supply noise is rejected, and the remainder is heavily attenuated because both rations are significantly greater than one. If Rbuffer were not nearly equal the trigger value for RSJ the common mode rejection would not be nearly as effective, which is why it is important to independently attenuate the supply noise.

As shown in FIG. 9a, when the network is sound and it's effective resistance negligible, the detection voltage 146a tracks the output of the buffer. Note, when the network is sound the detection voltage 146a is less than the fault trigger voltage by a nominal margin voltage 148. In this particular example the margin voltage is approximately equal to Von, e.g. 25 mV. In general the margin voltage is determined by where the sensitivity voltage is set. As shown in FIG. 9b, when the solder-joint network is faulty its effective resistance, hence detection voltage, 146b increases and exceeds fault trigger voltage 144, which causes the detector to output a fault signal. More specifically, the switching of a high resistor into the network produces an offset voltage at the RSJ/R3 junction that exceeds the designed for "margin voltage". When this occurs a fault is triggered.

Consider another example in which the high supply is nominally 3.15V, Von is 50 mV and the max output voltage of the buffer is 100 mV. If R1/R2 is selected to be 14:1 with R1=29.4 KOhms and R2=2.1 KOhms. The sensitivity and fault detection voltages are nominally 210 mV and 260 mV, respectively. The trigger value for RSJ is selected to be 200 Ohms and R3 is 3.6 KOhms. From eqn. 3, if the network is good and RSJ is negligible, the detection voltage tracks the buffer's output voltage of 50 mV+/−50 mV of noise. In this case, the margin voltage is approximately 160 mV. The effective resistance of the buffer for a 100 mV of noise is 125 ohms. If it turns out that the maximum output voltage of the buffer is only 50 mV instead of 100 mV the effective resistance is 62.5 ohms. Consequently, the effective trigger value of RSJ is 200 ohms plus 62.5 ohms=262.5 ohms. Because the circuit is monitoring the network to declare faults and not measure precise values of resistances this amount of variation is acceptable.

As illustrated by the above examples, the solder-joint detection circuit has a number of desirable characteristics. First, the circuit can trigger off a wide range of selectable network resistances RSJ with reasonable accuracy (marginally affected by any deviation in the actual and designed for noise at junction RSJ/R3). Second, the circuit can accurately set a sensitivity level to mask the noise at the RSJ/R3 junction to prevent false positives. Third, the circuit is insensitive to supply noise. Fourth, the circuit can be configured to monitor for faults 24-7 with low consumed power. Thus, the circuit can detect brief, transitory faults as well as permanent faults.

There are a number of aspects of the resistive bridge and detector that are important to achieve such performance in a practical low cost manner in an operational package. To keep the circuit simple and inexpensive, the high supply voltage used to power the package is preferably also used to set the sensitivity voltage. This supply might have considerable noise, unlike well-regulated test equipment. To mitigate this effect, both legs of the resistive bridge are tied to the high supply so that the common mode noise at the differential inputs to the comparator is rejected, at least partially. Because the ratios R1/R2 and R3/(Rbuffer+RSJ) are not the same, some portion of the supply noise can be seen by the comparator. To further mitigate this effect, the ratio of R1/R2 and R3/RSJ are preferably greater than one to attenuate the absolute noise seen at each of the junctions. In order to attenuate the supply noise, set the sensitivity voltage over a fairly broad range of values and keep power consumption low, the top of the bridge (R1 & R3) must be tied to the high supply. Furthermore, if the network includes a buffer on the die, the output voltage of the buffer must not only be fixed it must be held at is low output voltage. Otherwise, in practical circuit configurations, the circuit cannot detect small resistances RSJ while keeping power consumption low.

Figure 10:
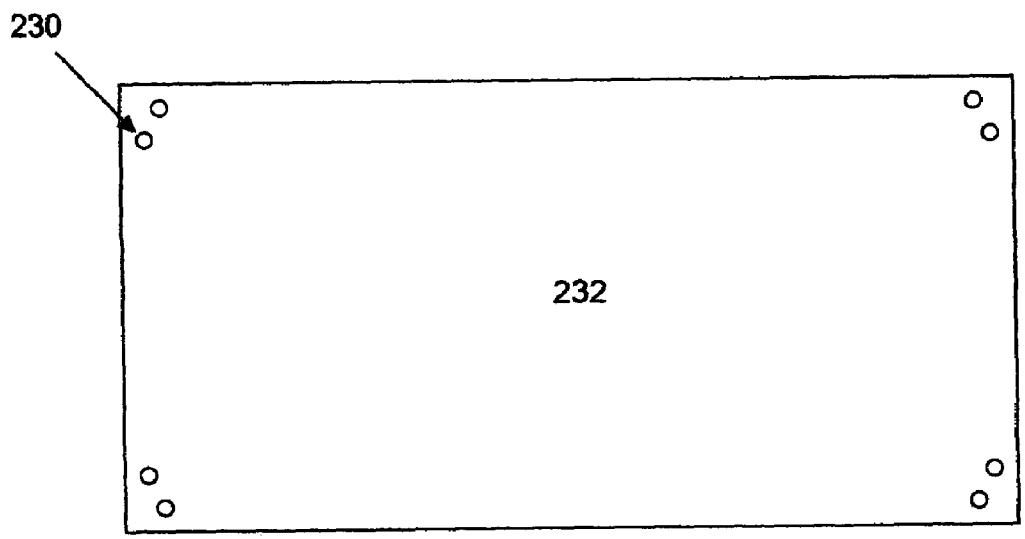
FIG. 10 is a plan view of a die illustrating a preferred location of the solder bumps to be tested.

As mentioned previously, the FPGA would not ordinarily be configured to test every pin (solder ball), to do so would consume excessive space on the die, be expensive and unnecessary. In a typical FPGA, a considerable number of the pins and portion of the available logic is not configured for the user application, as much as 40% or more. One approach would be to select and use test pins throughout the FPGA. In this case, the test pins would see approximately the same mechanical, thermal and general operational stress as the operational pins and should fail at about the same time and at the same rate. Another approach, as shown in FIG. 10, is to select and use test pins 230 on the FPGA 232 where they will experience the highest stress and thus have the highest probability of failing first. These test pins then act as "a canary in the mine", when one or more of the test pins fail, it is a good indicator that operational pins will soon fail. Depending upon the application, the PWB assembly and the FPGA mounted on it may be taken out of service immediately or scheduled for replacement prior to expected failure. In most applications, the greatest stress load will occur at one of the corners of the FPGA. Therefore, at least a couple test pins are positioned at each of the corners. Although typical FPGAs have many unused pins available for configuration as test pins, an FPGA may be configured using a 2:1 Mux so that an I/O pin can support both the test and user applications.

We claim:

1. A monitoring circuit providing in-situ monitoring of the integrity of solder-joint networks in an operational digital electronic package, comprising:
   a digital electronic package including pins configured to form an array of external solder-joint connections and a die mounted inside the package said die including electrical components configured using internal mechanical connections that are electrically coupled through operational pins to different ones of said external solder-joints to form respective operational solder-joint networks and together constituting the operational digital electronic package, said die also including an internal mechanical connection electrically coupled through a monitor pin to one of said external solder-joints to form a monitored solder-joint network that is held at a low voltage on the die;
   a resistor R3 coupled to a high supply voltage and connected in series with the resistance of the monitored solder-network at the monitor pin; and
   a detector that compares a detection voltage at the monitor pin to a sensitivity voltage and outputs a fault signal for the monitored solder-joint network that is an indicator of the integrity of the operational solder-joint networks.

2. The circuit of claim 1, further comprising means connected in series between high and low supply voltages to set the sensitivity voltage, wherein the package and said die are powered by the same high and low supply voltages.

3. The circuit of claim 2, wherein the means for establishing the sensitivity voltage comprises resistors R1 and R2 connected in series between high and low supply voltages to set the sensitivity voltage between R1 and R2 and wherein the ratio R1/R2 is greater than one.

4. The circuit of claim 3, wherein the ratio R1/R2 is greater than ten.

5. The circuit of claim 1, wherein, unless disabled, the detector monitors the monitored solder-joint network whenever power is supplied to the package.

6. The circuit of claim 1, wherein a plurality of said monitored solder-joint networks positioned near the corners of the digital electronic package are held at low voltages and connected to respective R3 resistors and detectors.

7. The circuit of claim 1, wherein the detector comprises a logic gate that outputs the fault signal and a differential comparator that compares the sensitivity and detection voltages to drive the logic gate between binary states.

8. The circuit of claim 7, wherein the logic gate is an AND gate, NAND gate or flip-flop gate/latch that receives the output of the differential comparator and an enable signal as inputs.

9. The circuit of claim 1, wherein the operational and monitored solder-joint networks each further comprise an output buffer on the die, said monitored solder-joint network output buffer's output voltage being held at the low voltage.

10. The circuit of claim 1, wherein in the absence of a fault in the monitored solder-joint network the detection voltage is less than the sensitivity voltage.

11. The monitoring circuit of claim 1, wherein the package comprises a ball grid array that provides the pins.

12. The monitoring circuit of claim 1, wherein the operational and monitored solder-joint networks further comprise at least one intermediate mechanical connection between the internal mechanical connection on the die and the external solder-joint connection.

13. The monitoring circuit of claim 1, wherein the die includes an array of operational buffer circuits configured to form the operational solder-joint networks, at least one operational network being designated as the monitored network that is held at the low voltage on the die.

14. A monitoring circuit providing in-situ monitoring of the integrity of a solder-joint networks, comprising:
a digital electronic package configured to form an array of external solder-joints and a die mounted therein, said die including an array of operational buffer circuits connected through I/O contacts to respective external solder-joints that form operational solder-joint networks; and
means coupled to one or more I/O contacts for designated operational buffer circuits for monitoring the integrity of the corresponding designated operational solder-joint networks during normal operation of the digital electronic package as an indicator of the integrity of the other operational solder joint networks.

15. The circuit of claim 14, wherein the one or more designated buffer circuits hold their designated operational solder-joint network at a low voltage on the die, said means coupling the designated operational solder-joint network to a high voltage to establish a detection voltage to monitor the integrity of the designated operational solder-joint network.

16. The circuit of claim 11, wherein, unless disabled, the means monitors the one or more designated operational solder-joint networks whenever power is supplied to the package.

17. The circuit of claim 14, wherein the I/O contacts comprise a ball grid array in which individual balls are configured to form the external solder-joint connections.

18. The circuit of claim 15, wherein said means establishes a sensitivity voltage between low and high supply voltages, said means configured to attenuate any noise on the high supply voltage by at least a factor of ten, said means comparing the detection voltage to the sensitivity voltage to output a fault signal.

19. The monitoring circuit of claim 14, wherein the die is a Field Programmable Gate Array (FPGA).

20. A monitoring circuit providing in-situ monitoring of the integrity of solder-joint networks in an operational digital electronic package, comprising:
a digital electronic package including a ball grid array configured to form external solder-joints and a die mounted inside the package, said die including an array of operational buffer circuits connected to respective external solder-joints that form operational solder-joint networks, an operational buffer circuit being designated as a monitored circuit in which the monitored operational solder-joint network is held at a low voltage on the die;
a resistor R3 coupled to a high supply voltage and connected in series with the effective resistance RSJ of the monitored network at the external solder-joint to establish a detection voltage; and
means coupled to the external solder-joint of the monitored network for monitoring the detection voltage during normal operation of the digital electronic package as an indicator of the integrity of the other operational solder joint networks.

21. The circuit of claim 20, wherein the means further comprises:
resistors R1 and R2 connected in series between high and low supply voltages to establish a sensitivity voltage at the series connection of the resistors with R1>R2 and R3>RSJ in the absence of a fault in the monitored network;
a differential comparator that compares the sensitivity and detection voltages and outputs a differential voltage signal; and
a logic gate that is driven between binary states by the differential voltage signal to indicate a fault in the monitored operational solder-joint network.

22. The circuit of claim 21, wherein, unless disabled, the logic gate monitors the monitored operational solder-joint network whenever power is supplied to the package.

23. The circuit of claim 22, wherein the logic gate is an AND gate, NAND gate or flip-flop gate/latch that receives the output of the differential comparator and an enable signal as inputs.

24. A method of monitoring in-situ the integrity of a solder-joint networks in an operational digital electronic package, comprising:
providing a digital electronic package including an array of pins and a die mounted inside the package, said die including electrical components configured using internal mechanical connections that are electrically coupled to operational pins and together constituting the operational digital electronic package, said die also including an internal mechanical connection that is held at a low voltage on the die and electrically coupled to a monitor pin;
forming external solder-joint connections at the respective operational and monitor pins to form respective operational and monitored solder-joint networks; and
monitoring a detection voltage at the monitor pin to output a fault signal for the monitored solder-joint network that is an indicator of the integrity of the operational solder-joint networks.

25. The method of claim 24, wherein the operational and monitored solder-joint networks each include an output buffer on the die, said monitored solder-joint network output buffer's output voltage being held low at the internal mechanical connection.

26. The method of claim 24, further comprising:
resistively dividing high and low supply voltages to establish a sensitivity voltage;
resistively coupling the monitored network's external solder-joint connection to the high supply voltage to establish the detection voltage at the monitor pin;
comparing the detection voltage to the sensitivity voltage to output the fault signal.

27. The method of claim 24, wherein, unless disabled, the integrity of the monitored solder-joint network is monitored as long as power is supplied to the package while the die is operational.

28. A monitoring circuit providing in-situ monitoring of the integrity of solder-joint networks in an operational digital electronic package, comprising:

a digital electronic package including an array of pins configured to form an array of external solder-joint connections and a die mounted inside the package, said die including electrical components configured using internal mechanical connections that are electrically coupled through operational pins to different ones of said external solder-joints to form respective operational solder-joint networks and together constituting the operational digital electronic package, said die also including an internal mechanical connection electrically coupled through a monitor pin to one of said external solder-joints to form a monitored solder-joint network; and means coupled to said monitor pin for monitoring the integrity of the monitored solder-joint network during normal operation of the operational digital electronic package as an indicator of the integrity of the operational solder joint networks.

29. The circuit of claim 28, wherein the die is a Field Programmable Gate Array (FPGA) having an array of operational buffer circuits configured to form the operational solder-joint networks, at least one operational network being designated as the monitored network that is held at the low voltage on the die.

30. The circuit of claim 28, wherein the package comprises a ball grid array that forms the array of pins.

* * * * *